(12) United States Patent
Lee et al.

(10) Patent No.: US 11,398,397 B2
(45) Date of Patent: Jul. 26, 2022

(54) ELECTROSTATIC CHUCK AND PLASMA PROCESSING APPARATUS INCLUDING THE SAME

(71) Applicant: SAMSUNG ELECTRONICS CO., LTD., Suwon-si (KR)

(72) Inventors: Yongwoo Lee, Hwaseong-si (KR); Youngjin Noh, Ansan-si (KR); Myungsun Choi, Hwaseong-si (KR); Minyoung Hur, Suwon-si (KR); Seungbo Shim, Seoul (KR); Jaehak Lee, Incheon (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 564 days.

(21) Appl. No.: 16/456,757

(22) Filed: Jun. 28, 2019

(65) Prior Publication Data
US 2020/0161157 A1 May 21, 2020

(30) Foreign Application Priority Data

Nov. 21, 2018 (KR) .................. 10-2018-0144455

(51) Int. Cl.
- *H01L 21/683* (2006.01)
- *H01L 21/3065* (2006.01)
- *H01J 37/32* (2006.01)

(52) U.S. Cl.
CPC .... *H01L 21/6833* (2013.01); *H01J 37/32532* (2013.01); *H01L 21/3065* (2013.01)

(58) Field of Classification Search
CPC ............ H01L 21/6833; H01L 21/3065; H01L 21/68757; H01J 37/32532; H01J 37/32715; H01J 2237/3343
USPC ......................................................... 361/234
See application file for complete search history.

(56) References Cited

U.S. PATENT DOCUMENTS

| | | | |
|---|---|---|---|
| 7,922,862 B2 | 4/2011 | Okumura et al. | |
| 8,284,538 B2 | 10/2012 | Himori et al. | |
| 8,512,511 B2 | 8/2013 | Himori et al. | |
| 8,741,098 B2 | 6/2014 | Koshiishi et al. | |
| 10,923,382 B2 * | 2/2021 | Uefuji | H01L 21/6833 |
| 2008/0073032 A1 | 3/2008 | Koshiishi et al. | |
| 2009/0101284 A1 | 4/2009 | Higuma et al. | |
| 2009/0199967 A1 | 8/2009 | Himori et al. | |
| 2010/0078129 A1 | 4/2010 | Himori et al. | |
| 2018/0358253 A1 | 12/2018 | Noh et al. | |

FOREIGN PATENT DOCUMENTS

KR 10-2018-0135152 A 12/2018

\* cited by examiner

*Primary Examiner* — Dharti H Patel
(74) *Attorney, Agent, or Firm* — Sughrue Mion, PLLC

(57) ABSTRACT

Electrostatic chucks, plasma processing apparatuses, and methods of fabricating semiconductor devices using the same are provided. The electrostatic chuck includes a chuck base, an upper plate provided on the chuck base, and an inner plate provided between the chuck base and the upper plate. A first diameter of the inner plate is less than a second diameter of the upper plate.

20 Claims, 5 Drawing Sheets

ELECTROSTATIC CHUCK AND PLASMA PROCESSING APPARATUS INCLUDING THE SAME

CROSS-REFERENCE TO RELATED APPLICATION

This application claims priority under 35 U.S.C. § 119 to Korean Patent Application No. 10-2018-0144455 filed on Nov. 21, 2018 in the Korean Intellectual Property Office, the disclosure of which is incorporated herein by reference in its entirety.

BACKGROUND

Apparatuses consistent with example embodiments of the present disclosure relate to an apparatus for fabricating a semiconductor device, and more particularly, to a plasma processing apparatus for fabricating a semiconductor device including an electrostatic chuck on which a substrate is loaded.

In general, semiconductor devices are fabricated through a plurality of unit processes. For example, the plurality of unit processes may include deposition processes including a thin-film deposition process, patterning processes including a photolithography process, and removal processes including an etching process. Here, the etching process may include a dry etching process in which a plasma reaction is used. A dry etching apparatus may include an electrostatic chuck on which a substrate is placed. The electrostatic chuck may generate an electrostatic force between the substrate and an electrode based on a voltage applied to the electrode to support the substrate.

SUMMARY

One or more example embodiments of the disclosure provide an electrostatic chuck capable of increasing a substrate etch uniformity and a plasma processing apparatus including the same.

According to an aspect of an example embodiment, there is provided an electrostatic chuck including: a chuck base; an upper plate provided on the chuck base; and an inner plate provided between the chuck base and the upper plate. A first diameter of the inner plate is less than a second diameter of the upper plate.

According to an aspect of another example embodiment, there is provided a plasma processing apparatus including: housing; an electrostatic chuck provided in the housing and configured to receive a substrate; and an edge ring surrounding the electrostatic chuck. The electrostatic chuck may include: a chuck base; an upper plate provided on the chuck base; and an inner plate provided between the chuck base and the upper plate. A first diameter of the inner plate is less than a second diameter of the upper plate.

BRIEF DESCRIPTION OF THE DRAWINGS

The above and/or other aspects will be more clearly understood from the following detailed description taken in conjunction with the accompanying drawings, in which.

DETAILED DESCRIPTION

Figure 1:
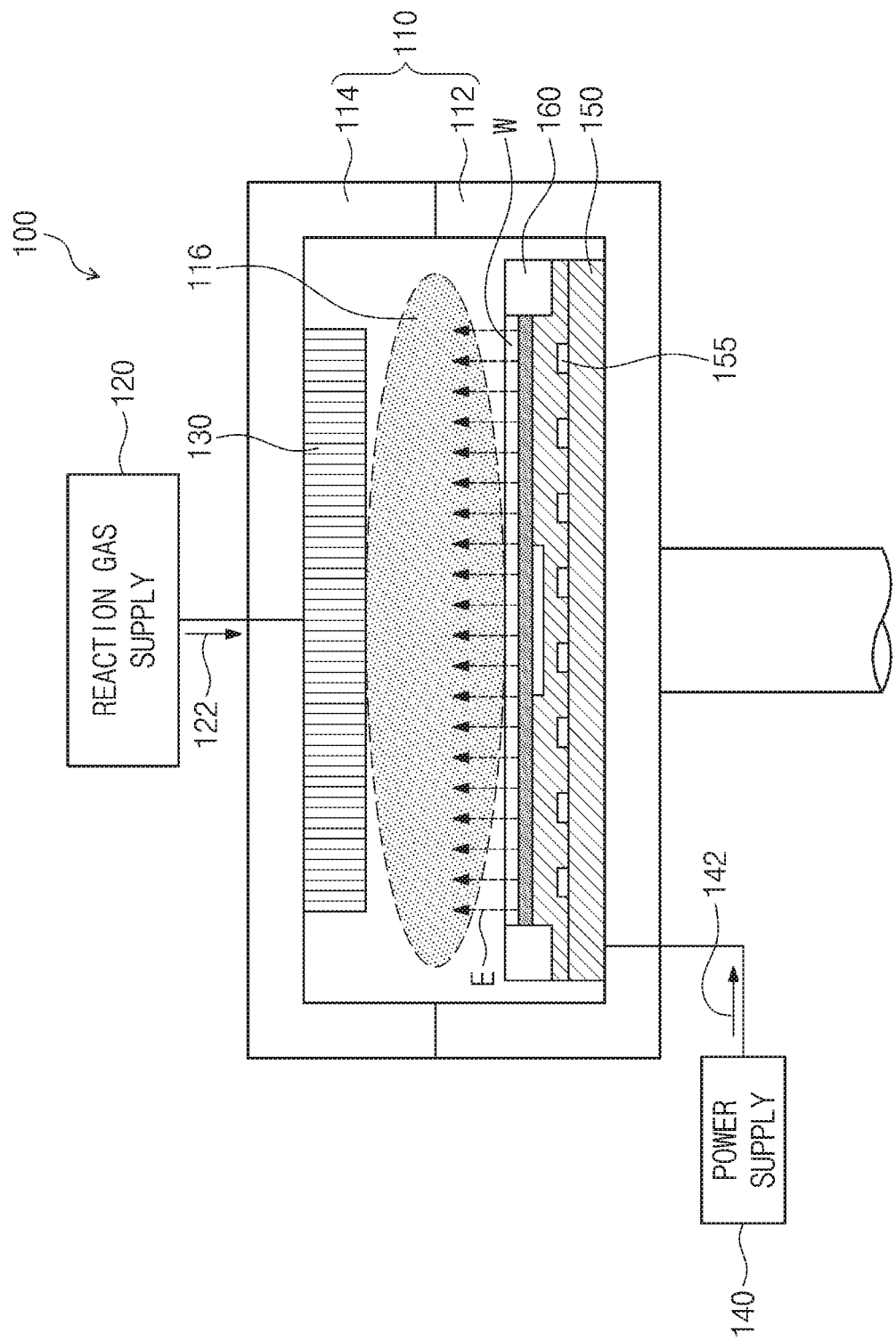
FIG. 1 illustrates a schematic diagram of a plasma processing apparatus according to an example embodiment.

FIG. 1 shows a plasma processing apparatus 100 according to an example embodiment.

Referring to FIG. 1, the plasma processing apparatus 100 may be a capacitively coupled plasma (CCP) etching apparatus. Alternatively, the plasma processing apparatus 100 may be an inductively coupled plasma (ICP) etching apparatus or a microwave plasma etching apparatus. The plasma processing apparatus 100 may include a housing 110, a reaction gas supply 120, a showerhead 130, a power supply 140, an electrostatic chuck 150, and an edge ring 160.

The chamber or housing 110 may provide an isolated internal space (i.e., a chamber) from the exterior of the plasma processing apparatus 100. A substrate W may be provided in the housing 110. The substrate W may include a silicon wafer, but embodiments are not limited thereto. The housing 110 may include a lower housing 112 and an upper housing 114. In order for the substrate W to be inserted into the housing 110, the lower housing 112 may be separated from the upper housing 114. In order for the substrate W to undergo the plurality of unit processes (e.g., an etching process and/or a deposition process) described above, the lower housing 112 may be joined with the upper housing 114.

The reaction gas supply 120 may supply a reaction gas 122 into the housing 110. The reaction gas 122 may etch the substrate W or deposit silicon oxide onto the substrate W. For example, the reaction gas 122 may include a methyl group ($CH_3$) or sulfur hexafluoride ($SF_6$), but embodiments are not limited thereto. Alternatively, the reaction gas 122 may deposit a thin layer (e.g., silicon dioxide ($SiO_2$), titanium nitride (TiN), or titanium oxide ($TiO_2$)) onto the substrate W.

The showerhead 130 may be provided in the upper housing 114. The showerhead 130 may be connected to the reaction gas supply 120 and may spray the reaction gas 122 onto the substrate W.

The power supply 140 may be connected to the electrostatic chuck 150. The power supply 140 may supply a high-frequency power 142 to the electrostatic chuck 150. The high-frequency power 142 may include a source power (e.g., 60 MHz) or a bias power (e.g., 2 MHz or 400 kHz). More specifically, the source power of the high-frequency power 142 may induce a plasma 116 in the housing 110. The bias power of the high-frequency power 142 may focus the plasma 116 upon the substrate W. When the substrate W or silicon (di)oxide (SiO$_2$) on the substrate W has an etching depth greater than a predetermined threshold value, the high-frequency power 142 may be provided in a pulsed mode.

The electrostatic chuck 150 may be installed in the lower housing 112. The electrostatic chuck 150 may support the substrate W. That is. the substrate W may be provided on the electrostatic chuck 150 to be fabricated. The electrostatic chuck 150 may use an external electrostatic voltage to firmly support the substrate W. When the high-frequency power 142 is supplied to the electrostatic chuck 150, the plasma 116 may be generated on the electrostatic chuck 150 and the substrate W. The plasma 116 may have a density that increases in proportion to the high-frequency power 142. In addition, the density of the plasma 116 may be proportional to an intensity of an electric field E generated on the electrostatic chuck 150. The electrostatic chuck 150 may be cooled with a coolant provided in one or more coolant holes 155.

The edge ring 160 may be disposed at an edge of the electrostatic chuck 150. The edge ring 160 may surround the substrate W. The edge ring 160 may prevent the plasma 116 from being applied to an outer circumferential surface and/or a sidewall of the substrate W. Alternatively, the edge ring 160 may be used to focus the plasma 116 upon the substrate W. The edge ring 160 may include silicon (Si) or silicon carbide (SiC).

The plasma 116 may be used to etch the substrate W or deposit a thin layer on the substrate W. When the density of the plasma 116 is increased, the substrate W may have an increased etching depth. In addition, when the plasma 116 has a uniform density over an entire top surface of the substrate W, etch uniformity of the substrate W may be improved. When the electric field E has a uniform intensity on an entire top surface of the electrostatic chuck 150, the etch uniformity of the substrate W may be improved.

An example of the electrostatic chuck 150 capable of increasing such an etch uniformity of the substrate W will now be described.

Figure 2:
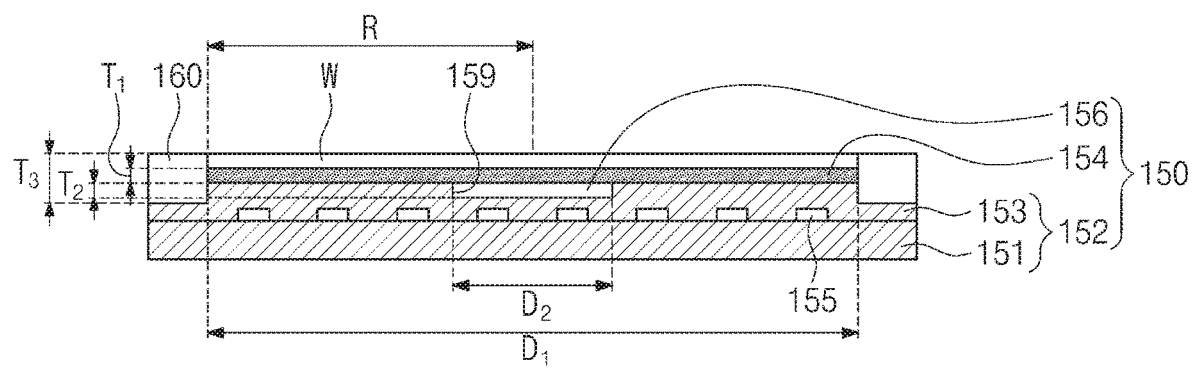
FIG. 2 illustrates a cross-sectional view showing an example of an electrostatic chuck shown in FIG. 1 according to an example embodiment.

FIG. 2 shows an example of the electrostatic chuck 150 illustrated in FIG. 1 according to an example embodiment.

Referring to FIG. 2, the electrostatic chuck 150 may include a chuck base 152, an upper plate 154, and an inner plate 156.

In plan view, the chuck base 152 may be wider or larger than the substrate W. The chuck base 152 may include aluminum or aluminum alloy. The chuck base 152 may include a first lower plate 151 and a second lower plate 153.

The first lower plate 151 may be flat.

The second lower plate 153 may be disposed on the first lower plate 151 and be supported by the first lower plate 151. The second lower plate 153 may have a diameter equal to or less than that of the first lower plate 151. The second lower plate 153 may include a recess 159. More specifically, the recess 159 may be provided in a top surface of the second lower plate 153. The recess 159 may be provided in a center of the second lower plate 153. The edge ring 160 may be disposed on an edge of the second lower plate 153. The coolant holes 155 may be formed between the first lower plate 151 and the second lower plate 153 to cool the electrostatic chuck 150.

The upper plate 154 may be disposed on the second lower plate 153 and be supported by the second lower plate 153. The upper plate 154 may be disposed within the edge ring 160. The upper plate 154 may include a sidewall being in contact with an inner sidewall of the edge ring 160. The substrate W may be provided on the upper plate 154 and be supported by the upper plate 154. The upper plate 154 may include a ceramic dielectric material such as alumina (Al$_2$O$_3$) and have a thickness T1 of about 0.3 mm (e.g., 0.3 mm±0.1 mm) to about 1.7 mm (e.g., 1.7 mm±0.1 mm). When the upper plate 154 is provided thereon with the substrate W, the upper plate 154 may insulate the substrate W from the chuck base 152. In plan view, the upper plate 154 may have the same size or width as that of the substrate W. For example, the upper plate 154 may have a diameter D1 of about 297 mm to about 300 mm and the substrate W may have a radius R of about 150 mm (e.g., 150 mm±1 mm).

The upper plate 154 may include an electrostatic electrode therein. The electrostatic electrode may use an external electrostatic voltage to firmly position the substrate W on the upper plate 154. The upper plate 154 may include dielectric protrusions formed on a top surface thereof. The dielectric protrusions may contact a bottom surface of the substrate W.

The inner plate 156 may be disposed between the second lower plate 153 and the upper plate 154. In plan view, the inner plate 156 may be disposed within the edge ring 160. The inner plate 156 may be disposed to fit in the recess 159 of the second lower plate 153. The inner plate 156 may have a top surface coplanar with that of the second lower plate 153 as shown in FIG. 2. The inner plate 156 may be in contact with or attached to a center of a bottom surface of the upper plate 154. Alternatively, the inner plate 156 and the upper plate 154 may be integrated as a single body. The inner plate 156 may include a ceramic of alumina (Al$_2$O$_3$). The inner plate 156 may have a diameter D2 less than the diameter D1 of the upper plate 154. For example, the diameter D2 of the inner plate 156 may fall within a range from about 40 mm (e.g., 40 mm±1 mm) to about 80 mm (e.g., 80 mm±1 mm). The inner plate 156 may be as thick as or thicker than the upper plate 156. The upper plate 156 may be thinner than the edge ring 160. For example, the inner plate 156 may have a thickness T2 of about 1.7 mm (e.g., 1.7 mm±0.1 mm) to about 5 mm (e.g., 5 mm±0.1 mm). The edge ring 160 may have a thickness T3 greater than or equal to about 7 mm (e.g., 7 mm±0.1 mm).

Figure 3:
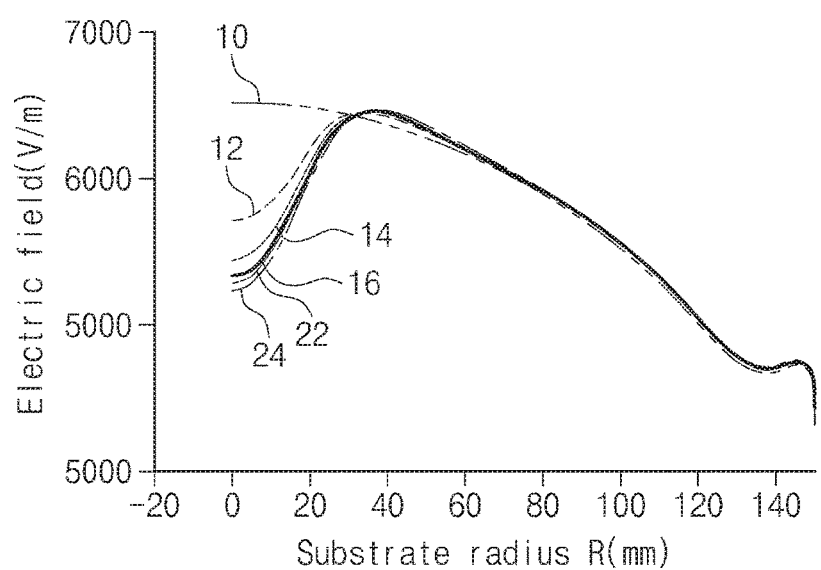
FIG. 3 illustrates a graph showing intensity variance of an electric field based on a thickness of an inner plate shown in FIG. 2.

FIG. 3 shows intensity variance of an electric field E generated on the upper plate 154 based on the thickness T2 of the inner plate 156 shown in FIG. 2 according to an example embodiment.

Referring to FIG. 3, when the electrostatic chuck 150 includes no inner plate 156 therein (curved line 10), the electric field E may have an intensity that gradually increases as approaching a central region from an edge region of the upper plate 154. In a case that that the electric field E has an intensity that increases as approaching the central region from the edge region of the upper plate 154, the substrate W may decrease in etch uniformity due to the intensity variance. The substrate W may have a radius R of about 150 mm (e.g., 150 mm±1 mm). The substrate W may be divided into a central region of the substrate W, which may occupy an area from a center of the substrate W to a location of about 75 mm (e.g., 75 mm±1 mm) from the center (i.e., a half-way), and an edge region of the substrate W, which may occupy an area from the location of about 75 mm of the center to a location of about 150 mm from the center. That is, the edge region surrounds the central region in a radial direction of the substrate W.

When the thickness T2 of the inner plate 156 is about 1.7 mm (e.g., 1.7 mm±0.1 mm), 3.3 mm (e.g., 3.3 mm±0.1 mm), or 5 mm (e.g., 5 mm±0.1 mm) (curved line 12, 14, or 16), the electric field E generated on the central region of the upper plate 154 may have an intensity (of the electric field E) that gradually decreases in reverse proportion to the thickness T2 of the inner plate 156. In a case that the electric field E has a reduced intensity on the central region of the upper plate 154, the electric field E may have a reduced difference in intensity between the central and edge regions of the upper plate 154. The reduction in difference in intensity of the electric field E may cause the electric field E to have a uniform intensity and the substrate W to have an improved etch uniformity.

When the thickness T2 of the inner plate 156 is about 7 mm (e.g., 7 mm±1 mm) or 20 mm (e.g., 20 mm±1 mm) (curved line 22 or 24), the electric field E may have an intensity that is saturated without being substantially attenuated on the central portion of the upper plate 154. In a case that the electric field E has a saturated intensity on the central region of the upper plate 154, the substrate W may no longer increase in etch uniformity.

The electric field E on the edge region of the substrate W may have an intensity that depends on a dielectric constant or a thickness of the edge ring 160. For example, when the dielectric constant of the edge ring 160 increases, the electric field E may have an increased intensity on the edge region of the substrate W. When the edge ring 160 decreases in thickness, the electric field E may have an increased intensity on the edge region of the substrate W.

Figure 4:
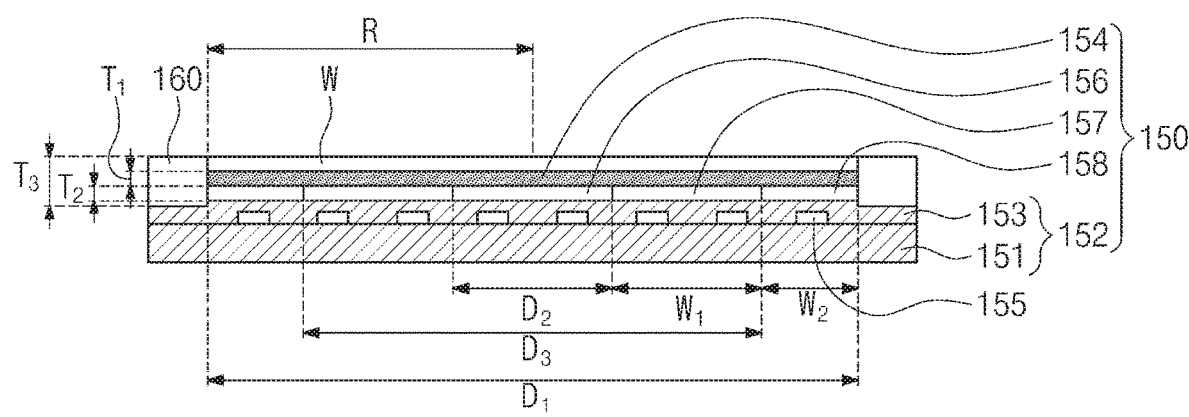
FIG. 4 illustrates a cross-sectional view showing another example of an electrostatic chuck shown in FIG. 1 according to an example embodiment.

FIG. 4 shows another example of the electrostatic chuck 150 illustrated in FIG. 1 according to an example embodiment.

Referring to FIG. 4, the electrostatic chuck 150 may include an inner dielectric ring 157 and an outer dielectric ring 158 which are disposed outside or around the inner plate 156 in a radial direction of the electrostatic chuck 150. That is, the inner dielectric ring 157 and the outer dielectric ring 158 surround the inner plate 156. The chuck base 152, the upper plate 154, and the edge ring 160 may be configured the same as those discussed with reference to FIG. 2.

The inner plate 156 may include a different material from that of the upper plate 154. The inner plate 156 may have a dielectric constant less than that of the upper plate 154. For example, the upper plate 154 may have a dielectric constant of about 9.1, and the inner plate 156 may have a dielectric constant of about 2. The upper plate 154 may include alumina, and the inner plate 156 may include polytetrafluoroethylene (PTFE) known as brand name of Teflon™.

The inner dielectric ring 157 may be disposed between the inner plate 156 and the outer dielectric ring 158. The inner dielectric ring 157 may have a top surface which is coplanar with that of the inner plate 156. The inner dielectric ring 157 may have a thickness being less than that of the edge ring 160 and the thickness being the same as the thickness T2 of the inner plate 156. The thickness of the inner dielectric ring 157 may fall within a range from about 1.7 mm (e.g., 1.7 mm±0.1 mm) to about 5 mm (e.g., 5 mm±0.1 mm). The inner dielectric ring 157 may contact the inner plate 156. The diameter D2 of the inner plate 156 may correspond to an inner diameter of the inner dielectric ring 157. The inner dielectric ring 157 may have a width W1 of about 60 mm (e.g., 60 mm±1 mm). The inner dielectric ring 157 may have an outer diameter D3 of about 240 mm. The inner dielectric ring 157 may have a dielectric constant greater than that of the inner plate 156 and less than that of the upper plate 154. For example, the inner dielectric ring 157 may have a dielectric constant of about 3. The inner dielectric ring 157 may include polyetheretherketone (PEEK), polybenzimidazole (PBI) known as brand name of Celazole™, or biaxially-oriented polyethylene terephthalate (boPET) known as brand name of Mylar™.

The outer dielectric ring 158 may be disposed outside or around the inner dielectric ring 157. The outer dielectric ring 158 may have a top surface being coplanar with that of the inner dielectric ring 157. The outer dielectric ring 158 may have a thickness being less than that of the edge ring 160 and have the thickness being the same as the thickness T2 of the inner plate 156. The thickness of the outer dielectric ring 158 may fall within a range from about 1.7 mm to about 5 mm. The outer dielectric ring 158 may contact the inner dielectric ring 157. That is, the outer dielectric ring 158 may have an inner diameter corresponding to the outer diameter D3 the inner dielectric ring 157. The outer dielectric ring 158 may have an outer diameter being equal to the diameter D1 of the upper plate 154. The outer dielectric ring 158 may have a width W2 of about 30 mm (30 mm±1 mm). The outer dielectric ring 158 may have a dielectric constant being greater than that of the inner dielectric ring 157 and the dielectric constant being less than that of the upper plate 154. For example, the outer dielectric ring 158 may have a dielectric constant of about 4. The outer dielectric ring 158 may include quartz.

Figure 5:
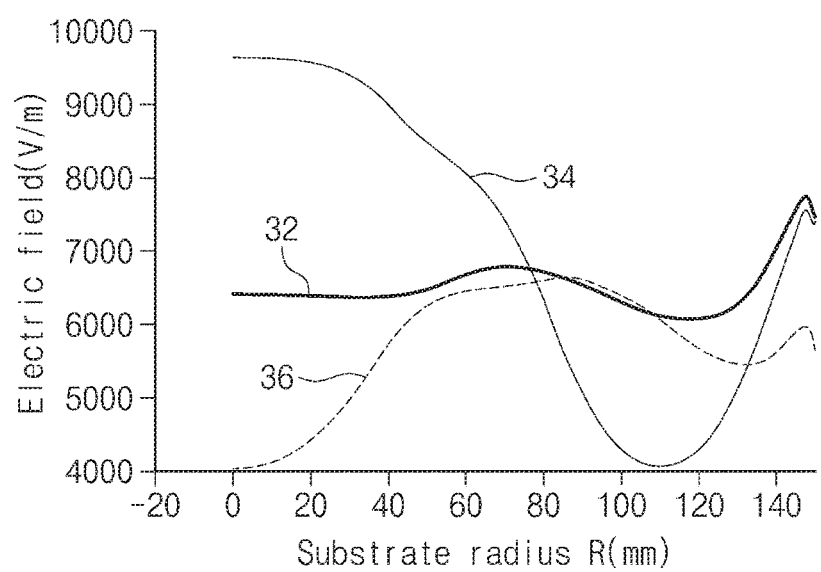
FIG. 5 illustrates a graph showing intensity variance of an electric field varies based on dielectric constants of an inner plate, an inner dielectric ring, and an outer dielectric ring shown in FIG. 4 according to an example embodiment.

FIG. 5 shows intensity variance of the electric field E based on dielectric constants of the inner plate 156, the inner dielectric ring 157, and the outer dielectric ring 158 according to an example embodiment.

Referring to FIG. 5, when the inner plate 156, the inner dielectric ring 157, and the outer dielectric ring 158 have respective dielectric constants of about 2.0, 3.0, and 4.0 (curved line 32), the electric field E may have a minimized difference in intensity between the central and edge regions of the substrate W. In a case that the electric field E has a minimized difference in intensity between the central and edge regions of the substrate W, etch uniformity of the substrate W may improve.

When the inner plate 156, the inner dielectric ring 157, and the outer dielectric ring 158 have respectively dielectric constants of about 9.1, 5.0, and 1.0 (curved line 34), the electric field E may have an intensity (of the electric field E) that is much greater on the central region of the substrate W than on the edge region of the substrate W. In this case, the electric field E may have an increased difference in intensity between the central and edge regions of the substrate W, and the etch uniformity of the substrate W may be diminished.

When the inner plate 156, the inner dielectric ring 157, and the outer dielectric ring 158 have respective dielectric constants of about 1.0, 5.0, and 9.1 (curved line 36), the electric field E may have an intensity that is much less on the central region of the substrate W than on the edge region of the substrate W. In this case, the electric field E may have an increased difference in intensity between the central and edge regions of the substrate W, and the etch uniformity of the substrate W may also be diminished.

Figure 6:
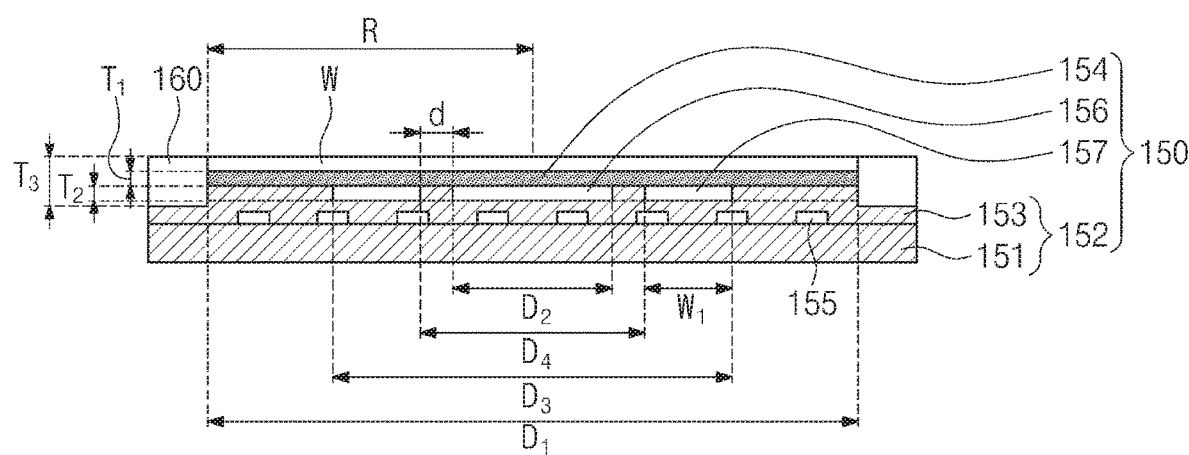
FIG. 6 illustrates a cross-sectional view showing another example of an electrostatic chuck shown in FIG. 1 according to an example embodiment.

FIG. 6 shows another example of the electrostatic chuck 150 shown in FIG. 1 according to an example embodiment.

Referring to FIG. 6, the electrostatic chuck 150 may include an inner dielectric ring 157 being separated from the inner plate 156. The chuck base 152, the upper plate 154, and the edge ring 160 may be configured the same as those discussed with reference to FIG. 1 or 4. In this example embodiment, the electrostatic chuck 150 may not include any outer dielectric ring 158 of FIG. 4. To separate the inner dielectric ring 157 and the inner plate 156, at least a portion of the second lower plate 153 of the chuck base 152 may be interposed between the inner plate 156 and the inner dielectric ring 157 in plan view. The inner dielectric ring 157 may be spaced apart at a first distance d from the inner plate 156. For example, the first distance d may be about 10 mm (e.g., 10 mm±1 mm) or less.

Figure 7:
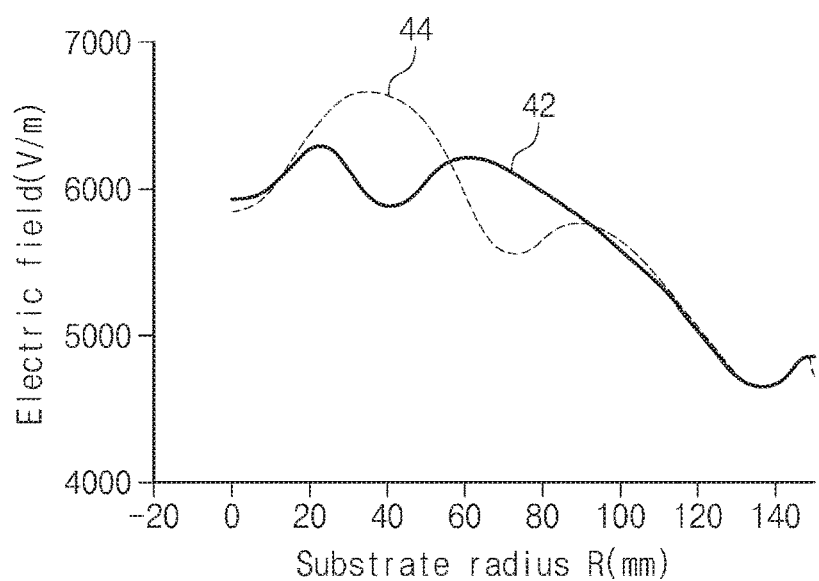
FIG. 7 illustrates a graph showing intensity variance of an electric field based on a distance between an inner plate and an inner dielectric ring shown in FIG. 6 according to an example embodiment.

FIG. 7 shows intensity variance of the electric field E based on the first distance d between the inner plate 156 and the inner dielectric ring 157.

Referring to FIG. 7, when about 10 mm is given to the first distance d between the inner plate 156 and the inner dielectric ring 157 (curved line 42), the electric field E may have a minimized difference in intensity (of the electric field E) on the central region of the substrate W. In a case that the electric field E has a minimized difference in intensity on the central region of the substrate W, the substrate W may increase in etch uniformity. The inner plate 156 may have a diameter D2 of about 40 mm (e.g., 40 mm±1 mm), and the inner dielectric ring 157 may have an inner diameter D4 of about 60 mm (e.g., 60 mm±1 mm), an outer diameter D3 of about 100 mm (e.g., 100 mm±1 mm), and a width W1 of about 20 mm (e.g., 20 mm±1 mm).

When about 30 mm is given to the first distance d between the inner plate 156 and the inner dielectric ring 157 (curved line 44), the electric field E may have an increased difference in intensity (of the electric field E) on the central region of the substrate W in comparison with the edge region of the substrate W. In a case that the electric field E has an increased difference in intensity, the etch uniformity of the substrate W may be diminished. The inner plate 156 may have a diameter D2 of about 40 mm (e.g., 40 mm±1 mm), and the inner dielectric ring 157 may have an inner diameter D4 of about 100 mm (e.g., 100 mm±1 mm), an outer diameter D3 of about 140 mm (e.g., 140 mm±1 mm), and a width W1 of about 20 mm (e.g., 20 mm±1 mm).

Figure 8:
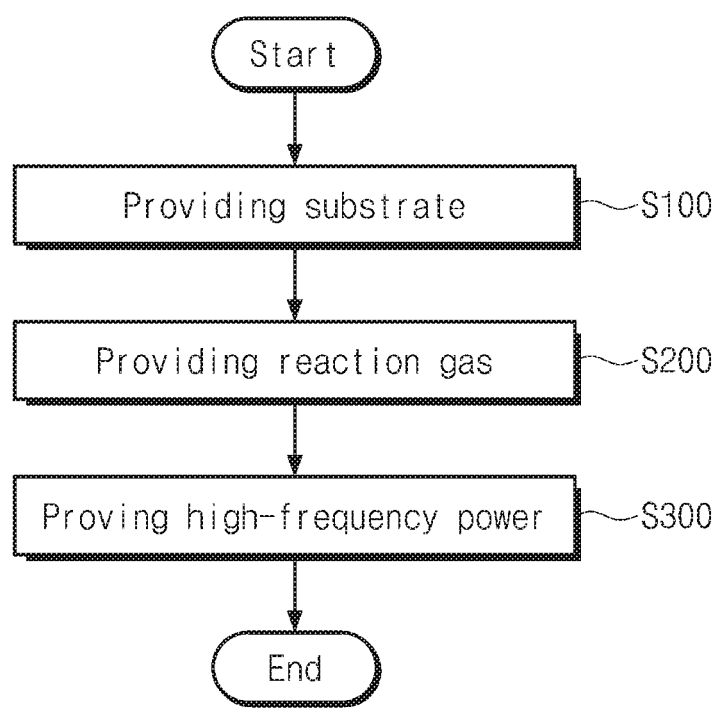
FIG. 8 illustrates a flow chart showing a method of fabricating a semiconductor device using the plasma processing apparatus of FIG. 1 according to an example embodiment.

FIG. 8 shows a method of fabricating a semiconductor device using the plasma processing apparatus 100 of FIG. 1.

Referring to FIGS. 1 and 8, according to an example embodiment, a method of fabricating a semiconductor device may include providing the substrate W (S100), providing the reaction gas 122 (S200), and providing the high-frequency power 142 (S300).

A robot arm may provide the substrate W on the electrostatic chuck 150 (S100).

The reaction gas supply 120 may supply the showerhead 130 with the reaction gas 122, and the showerhead 130 may supply the reaction gas 122 to the substrate W (S200).

The power supply 140 may supply the high-frequency power 142 to the electrostatic chuck 150 (S300). The electrostatic chuck 150 may use the high-frequency power 142 to generate the plasma 116 of the reaction gas 122 on the substrate W. The inner plate 156 of the electrostatic chuck 150 may be used to control the electric field E to have a uniform intensity and/or the plasma 116 to have a uniform density, with the result that the etch uniformity of the substrate W may improve.

According to example embodiments, an electrostatic chuck may be configured to use an inner plate between a chuck base and an upper plate and to control an electric field to generate a uniform intensity of the electric field, which may result in an increase in etch uniformity of a substrate.

Although example embodiments have been described, it will be understood by those skilled in the art that various changes and modifications may be made without departing from the technical spirit and essential feature of the present disclosure. Accordingly, all such modifications are intended to be included within the scope of the present disclosure as defined in the claims.

What is claimed is:

1. An electrostatic chuck comprising:
a chuck base;
an upper plate provided on the chuck base; and
an inner plate provided between the chuck base and the upper plate, the inner plate having a first diameter that is less than a second diameter of the upper plate,
wherein the inner plate has a first dielectric constant different from a second dielectric constant of the upper plate.

2. The electrostatic chuck of claim 1, wherein the first dielectric constant is less than the second dielectric constant.

3. The electrostatic chuck of claim 2, wherein the inner plate includes polytetrafluoroethylene.

4. The electrostatic chuck of claim 2 further comprising an outer dielectric ring surrounding the inner plate, an outer diameter of the outer dielectric ring being equal to the second diameter of the upper plate.

5. The electrostatic chuck of claim 4, wherein the outer dielectric ring has a third dielectric constant that is greater than the first dielectric constant of the inner plate.

6. The electrostatic chuck of claim 4, wherein the outer dielectric ring comprises quartz.

7. The electrostatic chuck of claim 5 further comprising an inner dielectric ring provided between the outer dielectric ring and the inner plate.

8. The electrostatic chuck of claim 7, wherein the inner dielectric ring has a fourth dielectric constant that is less than the third dielectric constant of the outer dielectric ring and is greater than the first dielectric constant of the inner plate.

9. The electrostatic chuck of claim 7, wherein the inner dielectric ring includes polyetheretherketone, polybenzimidazole, or biaxially-oriented polyethylene terephthalate.

10. The electrostatic chuck of claim 1, wherein the inner plate has a first thickness that is one to three times of a second thickness of the upper plate.

11. The electrostatic chuck of claim 10, wherein the first thickness of the inner plate is equal to or less than about 20 mm.

12. The electrostatic chuck of claim 11, wherein the first thickness of the inner plate has a range between about 1.7 mm and about 5 mm.

13. The electrostatic chuck of claim 1, wherein the first diameter of the inner plate has a range between about 40 mm and about 80 mm.

14. The electrostatic chuck of claim 1, wherein the chuck base comprises:
a first lower plate; and
a second lower plate provided on the first lower plate, the second lower plate comprising a recess provided in the second lower plate, and
wherein the inner plate is provided in the recess of the second lower plate.

15. The electrostatic chuck of claim 14, wherein the recess is provided in a center portion of the second lower plate.

16. A plasma processing apparatus comprising:
a housing;
an electrostatic chuck provided in the housing and configured to receive a substrate; and
an edge ring surrounding the electrostatic chuck,
wherein the electrostatic chuck comprises:
a chuck base;
an upper plate provided on the chuck base; and
an inner plate provided between the chuck base and the upper plate, the inner plate having a first diameter that is less than a second diameter of the upper plate, and wherein the inner plate has a first dielectric constant different from a second dielectric constant of the upper plate.

17. The plasma processing apparatus of claim 16, wherein the edge ring is provided on an edge of the chuck base and surrounds an outer circumference of the upper plate, and
wherein the inner plate is provided within the edge ring and is thinner than the edge ring.

18. The plasma processing apparatus of claim 17, wherein the electrostatic chuck further comprises an outer dielectric ring provided within the edge ring and surrounding the inner plate.

19. The plasma processing apparatus of claim 18, wherein the electrostatic chuck further comprises an inner dielectric ring provided within the edge ring and between the inner plate and the outer dielectric ring.

20. The plasma processing apparatus of claim 19, wherein the inner dielectric ring is spaced apart at about 10 mm or less from the inner plate.

* * * * *